United States Patent [19]

Wareing et al.

[11] 3,952,568

[45] Apr. 27, 1976

[54] VACUUM PROCESSING OF ROD, WIRE OR STRIP MATERIAL

[75] Inventors: Joseph Brian Wareing, Chester; Herbert Hall, Wakefield, both of England

[73] Assignees: The Electricity Council, London; Johnson & Nephew (Non-Ferrous), Manchester, both of England

[22] Filed: Sept. 4, 1974

[21] Appl. No.: 503,193

[52] U.S. Cl. ............................ 72/38; 29/DIG. 44; 72/46; 72/342; 118/50; 432/242
[51] Int. Cl.² ................. B21D 37/16; C23C 13/10; F27D 1/00
[58] Field of Search ................ 29/DIG. 21, DIG. 44; 34/242; 72/38, 39, 47, 342, 46; 117/61, 119; 134/9, 15, 21; 277/223, 224; 432/242; 118/50

[56] References Cited
UNITED STATES PATENTS

| | | |
|---|---|---|
| 1,785,037 | 12/1930 | Martell et al. .................... 117/119 |
| 2,708,843 | 5/1955 | Gibson et al. .................... 34/242 |
| 2,924,329 | 2/1960 | Compson .......................... 72/342 |
| 3,850,139 | 11/1974 | Franke et al. .................... 117/119 |

*Primary Examiner*—C. W. Lanham
*Assistant Examiner*—E. M. Combs
*Attorney, Agent, or Firm*—Beveridge, DeGrandi, Kline & Lunsford

[57] ABSTRACT

A seal permitting wire, rod or the like to be fed continuously into a vacuum treatment chamber comprises two die-shaped elements conforming to the peripheral shape of the wire, rod or the like in spaced holders with a tube sealed between the holders and a removable insert in the tube externally fitting closely within the tube.

7 Claims, 2 Drawing Figures

VACUUM PROCESSING OF ROD, WIRE OR STRIP MATERIAL

FIELD OF THE INVENTION

This invention relates to seals for enabling lengths of uniform section material, e.g. rod or wire to be fed continuously through a wall separating regions at different pressures and to apparatus using such seals. Such seals are required, for example, in apparatus where the rod or wire is subjected to a treatment, for example heat treatment or coating, which has to be carried out in a vacuum if the treatment is to be carried out as a continuous operation. It enables the rod or wire to be continuously fed through a vacuum enclosure hence permitting of a continuous process operation.

SUMMARY OF THE INVENTION

According to one aspect of this invention, a seal permitting the feeding of material of uniform section through a wall separating regions at different pressures comprises a pair of die-shaped elements located in spaced holders, a tube sealed between said holders and a removable insert in said tube externally fitting closely within the tube.

The size of the die-shaped elements is such that there is a clearance in the range 0.1 mm to 0.2 mm around the material to be fed through the seal.

By this arrangement, the seal has two die-shaped elements which can be shaped to conform to the peripheral shape of the material to be fed into the vacuum enclosure and can be made to fit closely around the material; typically, for a circular rod or wire, they might be wire-drawing dies 0.12 mm oversize in diameter for a circular rod or wire. The insert or inserts in the tube are preferably cylinders. They have to be made of a material suitable for the particular conditions to which they are subjected; thus the material must withstand the appropriate temperature if the rod or wire is heated; the material of the inserts should not abrade the material passing therethrough and should preferably have adequate wearing properties. The inserts may be made of a plastics material such as nylon if the material to be fed through the seal is at a suitably low temperature, for example between 0° and 120°C. or may be made of a ceramic material such as unfired or partly fired pyrophyllite or a bonded asbestos material such as Syndanio if the material to be fed through the seal is of a high temperature. Such an insert would be made to have a bore fitting closely around the material to be fed through the seal but would have to have a bigger tolerance than the die-shaped elements; typically with circular rod or wire, the insert bore might be 1 mm larger in diameter than that of the rod or wire. However, by making such an insert very long, and by making it fit closely within the outer tube, the leakage of air through the system can be kept very small. Such a seal is used with a continuously evacuated vacuum enclosure, the seal keeping the leakage within the pumping capacity of the vacuum pump. By using two such seals in series it has been found readily possible to limit the passage of air through the seals such that pumping in the vacuum chamber can readily keep the pressure down to less than 1 Nm$^{-2}$ against a full atmosphere at the input end of the seals. The addition of a further identical stage in such an arrangement would enable a vacuum pressure of the order of 10$^{-3}$ Nm$^{-2}$ to be achieved.

For passing a length of material through a vacuum chamber, similar sealing arrangements may be used at the entry to and the exit from the vacuum chamber. Two or more seals may be used in series, possibly with intermediate vacuum stages between the successive seals.

The invention furthermore includes within its scope apparatus for the vacuum processing of rod, wire or strip material of uniform section, comprising a vacuum chamber, two aligned sealing systems, each containing at least one seal as described above and arranged respectively for the entry into and exit from the chamber of the rod, wire or strip material and means for moving the material through said chamber and sealing systems.

It will be noted that, with the above-described arrangement, the material to be fed through the seal could be of any section; it is merely necessary to have dies shaped in accordance with the peripheral shape of the material. The material may typically be rod or wire or strip metal such as strip for transformer windings; strip material of sections up to say 50 × 10 mm may be passed through a seal as described above. Preferably the die holders are arranged so that die-shaped elements can readily be changed when it is required to change the size of the material passing through the seal. Likewise the insert in the aforementioned tube may readily be changed. For cleaning an insert, it is preferred to make it in the form of a cylinder split axially along its length.

The insert must have sufficient clearance of the material to be fed through the seal so as not to restrict the movement of the material and subject it to wear or drag even although the material may have to be fed at a fairly high speed through the system. The die-shaped elements not only provide a severe restriction of the air flow but they serve to maintain the material being fed through the seal in a central position through the insert or inserts. They will also damp out vibrations caused for example by the means moving the material through the seal.

The aforementioned die holders are preferably provided with flanges for securing to flanges on said tube. One of the die holders may also be provided with a further flange for securing the die holder into an opening in the vacuum chamber.

DESCRIPTION OF THE PREFERRED EMBODIMENTS

Figure 1:
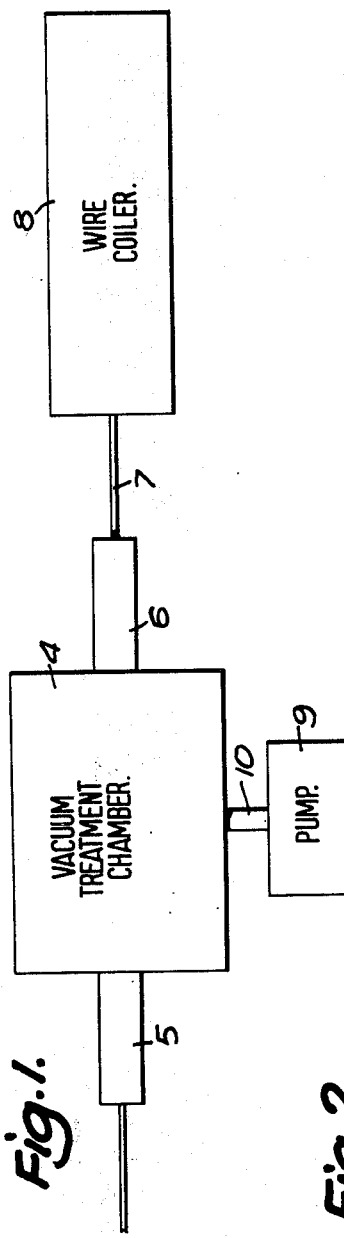
FIG. 1 is a diagram illustrating apparatus for vacuum treatment of a round or shaped wire or rod of uniform section.

Referring to FIG. 1, there is shown diagrammatically an apparatus for the continuous treatment of wire or rod or other material of uniform section in a vacuum chamber. The treatment may, for example, be heat treatment using electron beam bombardment or coating using sputtering. Two or more stages of treatment may be carried out in the vacuum chamber which, in such cases, may be sub-divided to have compartments which may be maintained with different atmospheres or at different pressures. The apparatus consists essentially of a treatment chamber with aligned inlet and outlet seals 5, 6 respectively through which the material 7 to be treated is pulled by a wire coiler 8. The chamber 4 is connected to a vacuum pump 9 by a pipe 10. If the chamber 4 is sub-divided, separate pumps may be provided for each compartment.

Figure 2:
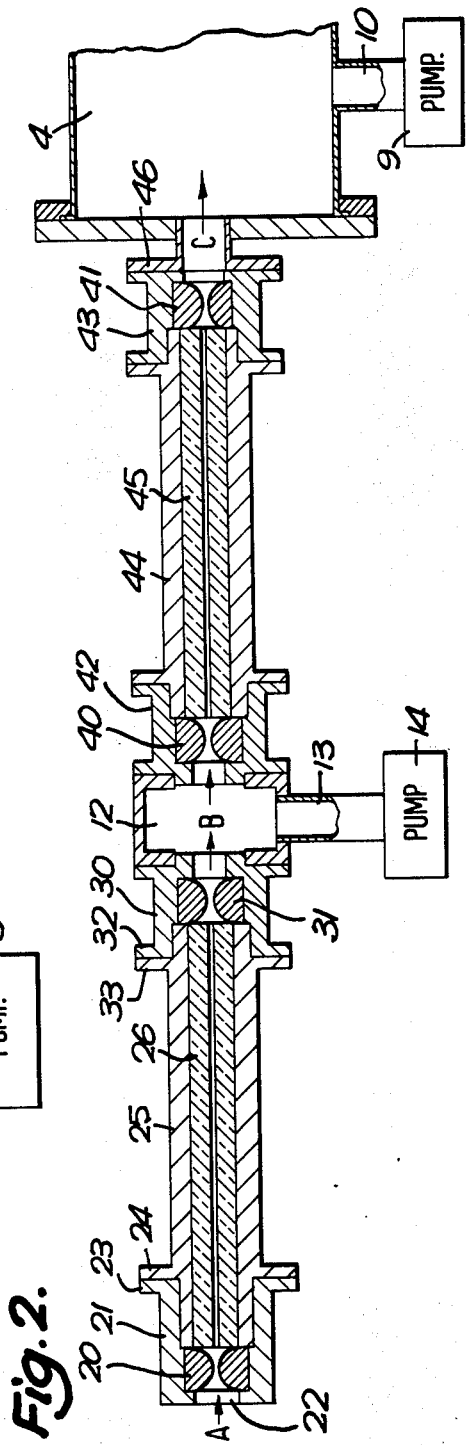
FIG. 2 is a longitudinal section of an air-to-vacuum seal unit in the apparatus of FIG. 1.

The inlet and outlet seals 5, 6 are similar and FIG. 2 illustrates a two stage inlet seal 5 with the end A, at which the wire enters open to atmosphere and the end C leading into a high vacuum chamber which constitutes the aforementioned chamber 4 and which is connected to pump 9. Intermediate between the two sealing stages in FIG. 2 at B is a small vacuum chamber 12 which is connected by a pipe 13 to a pump 14.

At the inlet end A, a die-shaped element 20 is housed within a die holder 21 having an end opening 22 for the entry of the wire and having at the other end a flange 23 which is secured to a mating flange 24 on a tube 25 sealed into the end of the die holder 21. The die-shaped element 20 is shaped, in transverse section, to correspond to the shape of the wire or rod or other material to be passed through the vacuum chamber. It is similar in construction to a conventional wire drawing die but is oversize by 0.1 to 0.2 mm. In this particular embodiment, for a circular wire or rod, it is 0.12 mm oversize in diameter. The element 20 is parabolic in axial section so as to give a smooth lead in to and lead out from the region of smallest cross-section. The tube 25 contains a cylindrical insert 26 of nylon with an axial hole which is 1 mm larger in diameter than the wire. This cylindrical insert 26 is split along its length to facilitate cleaning. It fits closely within the tube 25 but is removable therefrom. The insert 26 extends along the whole length of the tube 25 which, at its far end, extends into and is sealed into a holder 30 for a second die-shaped element 31, this holder 30 having a flange 32 mating with the flange 33 on the tube 25. The die-shaped element 31 is a parabolic die similar to the die-shaped element 20 and 0.12 mm oversize on the wire. The holder 30 is sealed to the aforementioned chamber 12.

The second seal is similar to the first seal and has two die-shaped elements 40 and 41 in holders 42, 43 respectively with a tube 44 between the die housings, this tube containing a split cylindrical insert 45. The second die housing is sealed to an inlet 46 to the aforementioned high vacuum chamber 11.

All the die-shaped elements are removable from their holders and replaceable. They fit closely around the wire and hence permit only very little air to pass through the seal. The relatively long inserts which fit closely within their respective tubes again provide a restrictive air passage. Typically, for a wire 6 mm in diameter, this seal assembly with two seals might be about 1 meter long. In this particular arrangement the chamber 12 between the two seal stages is pumped to a pressure of around 500 $Nm^{-2}$ by continuous evacuation with a pump. The high vacuum chamber 11 is kept at a pressure of less than 1 $Nm^{-2}$. The intermediate chamber 12 preferably has a conical wire guide (not shown) to assist initial threading of the wire through the system.

If the wire is at an elevated temperature, the die holders and the tubes may be water cooled.

It will be noted that this construction may be used for wire of any section, for example, round, square or rectangular shaped cross-section; the die-shaped elements and inserts would be made to conform to the general shape of the wire cross-section. For rectangular sections, such as metal strip used in winding transformer cores, adjustable dies may be used as the die-shaped elements. The inserts 26, 45 have sufficient clearance of the wire so as not to restrict the movement of the wire and subject it to wear or drag even although the wire is fed at a fairly high speed through the system. The die-shaped elements 20, 31, 40, 41 not only provide a severe restriction of the air flow into the vacuum chamber 10 but serve also to maintain the wire in a central position through the insert or inserts. They will also damp out vibrations such as might be caused by the wire coiler 8.

The die-shaped elements such as elements 20, 31 in one embodiment are made of tungsten carbide mounted in water-cooled brass holders. Where there is water vapour present, e.g. in the outlet seal for a copper wire annealer, diamond dies may be used.

We claim:
1. A seal permitting the feeding of a rod or wire material of predetermined uniform section through a wall separating regions at different pressures in vacuum apparatus for processing the rod or wire, said seal comprising a pair of spaced die-holders; a pair of die-shaped elements located one in each of said spaced die-holders, each die-shaped element being formed of a hard rigid material and being of parabolic form in axial section to have a smoothly-curved convergent entry portion leading to the narrowest portion and a smoothly-curved divergent exit portion, said die-shaped elements furthermore having dimensions to give a clearance of between 0.1 and 0.2 mm around the rod or wire to be fed therethrough; a tube sealed between said spaced die-holders; and a removable insert of non-abrasive material in said tube closely fitting within the tube, and having an opening extending therethrough for receiving the rod or wire to be fed through said seal.

2. A seal as claimed in claim 1 and for use with circular rod or wire, wherein the die-shaped elements are of circular section.

3. A seal as claimed in claim 1 and for use with rectangular section material, wherein the die-shaped elements are of rectangular section and adjustable in at least one transverse dimension for adjusting the size of the aperture.

4. A seal as claimed in claim 1 wherein each removable insert is a cylinder.

5. A seal as claimed in claim 1 wherein each removable insert is a cylinder divided into two parts along its axis.

6. A seal as claimed in claim 1 wherein said die holders are provided with flanges for securing to flanges on said tube.

7. A seal as claimed in claim 1 wherein said die-shaped elements are formed of tungsten carbide.

* * * * *